United States Patent
Kang et al.

(10) Patent No.: US 7,362,612 B2
(45) Date of Patent: Apr. 22, 2008

(54) PROGRAM METHOD FOR FLASH MEMORY CAPABLE OF COMPENSATING FOR THE REDUCTION OF READ MARGIN BETWEEN STATES

(75) Inventors: Sang-gu Kang, Suwon-si (KR); Young-Ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/598,090

(22) Filed: Nov. 13, 2006

(65) Prior Publication Data

US 2007/0171709 A1   Jul. 26, 2007

(30) Foreign Application Priority Data

Jan. 24, 2006   (KR)   ............. 10-2006-0007416

(51) Int. Cl.
*G11C 16/06* (2006.01)

(52) U.S. Cl. ............. 365/185.09; 365/185.17; 365/185.18

(58) Field of Classification Search ........... 365/185.09, 365/185.17, 185.18
See application file for complete search history.

(56) References Cited

U.S. PATENT DOCUMENTS

2005/0219896 A1* 10/2005 Chen et al. ............ 365/185.03
2006/0227618 A1* 10/2006 Lee ....................... 365/185.22

\* cited by examiner

*Primary Examiner*—Connie C. Yoha
(74) *Attorney, Agent, or Firm*—Volentine & Whitt, PLLC

(57) ABSTRACT

The invention provides a programming method for a flash memory device including first and second bitlines connected with a plurality of memory cells for storing multi-bit data indicating one of a plurality of states. The program method may include programming memory cells, connected with a selected row and the second bitlines, with multi-bit data; determining whether the selected row is the last row; and reprogramming programmed memory cells connected with the selected row being the last row and the first bitlines when the determination result is that the selected row is the last row.

18 Claims, 8 Drawing Sheets

Programmed Memory Cell    Memory Cell To Be Programmed

PROGRAM METHOD FOR FLASH MEMORY CAPABLE OF COMPENSATING FOR THE REDUCTION OF READ MARGIN BETWEEN STATES

BACKGROUND OF THE INVENTION

1. Field of the Invention

Embodiments of the invention relate to flash memory devices. More particularly, embodiments of the invention relate to a programming method for flash memory devices capable of compensating for a reduction of read margin between memory cell program states.

This U.S. non-provisional patent application claims priority under 35 U.S.C §119 of Korean Patent Application 2006-07416 filed on Jan. 24, 2006, the entire contents of which are hereby incorporated by reference.

2. Discussion of Related Art

In recent years, storage devices such as volatile memory devices and nonvolatile memory devices have been increasingly applied to MP3 players and mobile appliances such as, for example, portable multimedia players (PMPs), cellular phones, notebook computers, and personal digital assistances (PDAs). The MP3 players and the mobile appliances require mass storage devices for offering various functions (e.g., moving picture playback). Many efforts have been made for meeting the requirement. One of these efforts is to propose a multi-bit memory device where at least 2-bit data are stored in one memory cell. Exemplary multi-bit memory devices are disclosed, for example, in U.S. Pat. Nos. 6,122,188; 6,075,734; and 5,923,587 which are incorporated herein by reference.

When 1-bit data is stored in one memory cell, the memory cell has a threshold voltage belonging to one of two threshold voltage distributions, i.e., the memory cell has one of two states indicating data "0" and data "1". On the other hand, when 2-bit data is stored in one memory cell, the memory cell has a threshold voltage belonging to one of four threshold voltage distributions, i.e., the memory cell has one of four states indicating data "11", data "10", data "00", and data "01". Threshold voltage distributions corresponding to four states are illustrated in FIG. 1.

Threshold voltage distributions corresponding to four states should be carefully controlled such that each of the threshold voltage distributions exists within a determined threshold voltage window. In order to achieve this, a programming method using an increment step pulse programming (ISPP) scheme has been suggested. In the ISPP scheme, a threshold voltage shifts by the increment of a program voltage according to the repetition of program loops. By setting the increment of a program voltage to a small value, threshold voltage distributions may be minutely controlled to secure a sufficient margin between states. Unfortunately, this leads to increase of time required for programming a memory cell to reach a desired state. Accordingly, the increment of the program voltage may be determined based on the programming time.

In spite of such an ISPP scheme, a threshold voltage distribution of each state is generated to be wider than a desired window due to various causes. For example, as indicated by dotted lines 10, 11, 12, and 13 of FIG. 1, a threshold voltage distribution is widened due to a coupling between adjacent memory cells in a programming operation. Such a coupling is called an "electric field coupling" or "F-poly coupling". For example, as illustrated in FIG. 2, assuming that a memory cell MCA is a cell programmed to have one of four states and a memory cell MCB is a cell programmed to have one of four states, charges are accumulated in a floating gate (FG) as the memory cell MCB is programmed. When memory cell MCB is programmed, a voltage of floating gate FG of adjacent memory cell MCA rises due to a coupling between floating gates FG of the memory cells MCA and MCB. The rising threshold voltage is maintained due to a coupling between floating gates even after programming memory cell MCB. The memory cell MCB includes memory cells arranged in a wordline direction and/or a bitline direction relative to the memory cell MCA. Due to such a coupling, the threshold voltage of the programmed memory cell MCA rises and the threshold voltage distributions are widened as indicated by the dotted lines 10, 11, 12, and 12 of FIG. 1. Accordingly, a margin between states is reduced, as illustrated in FIG. 1 which is a reduction of the read margin (difference in voltage in determining the presence of a "1" or a "0").

One conventional technique for preventing a threshold voltage distribution from being widened due to a coupling is disclosed in U.S. Pat. No. 5,867,429.

Not only an electric field coupling/F-poly coupling but also a read margin between states is reduced as threshold voltages of memory cells drop with the lapse of time, which will be hereinafter referred to as "hot temperature stress (HTS)". HTS means that charges accumulated in a floating gate of a memory cell are drained to a substrate. As the charges of the floating gate are reduced, threshold voltages of memory cells in respective states drop, as indicated by dotted lines 20, 21, and 22 of FIG. 3. Accordingly, a threshold voltage increases due to an electric field coupling/F-poly coupling and a threshold voltage decreases due to HTS which makes it difficult to secure a read margin between states. In particular, it is difficult to know a state of the programmed memory cell. This problem becomes severe with the recent trend toward more complex semiconductor fabrication processes.

Accordingly, there is a need for securing a read margin between states even if a threshold voltage increases due to an electric field coupling/F-poly coupling and a threshold voltage decreases due to HTS.

SUMMARY OF THE INVENTION

Exemplary embodiments of the invention are directed to a programming method for a flash memory device including first and second bitlines connected with a plurality of memory cells for storing multi-bit data indicating one of a plurality of states. In an exemplary embodiment, the program method may include programming memory cells, connected with a selected row and the second bitlines, with multi-bit data; determining whether the selected row is the last row; and reprogramming programmed memory cells connected with the selected row being the last row and the first bitlines when the determination result is that the selected row is the last row, whereby increasing a read margin between adjacent states is reduced due to high temperature stress (HTS).

DESCRIPTION OF EMBODIMENTS

Figure 1:
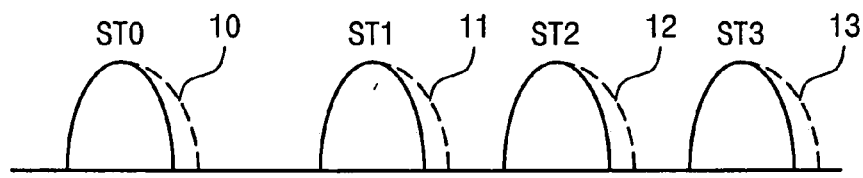
FIG. 1 illustrates widened threshold voltage distributions associated with electric field coupling/F-poly coupling.
Figure 2:
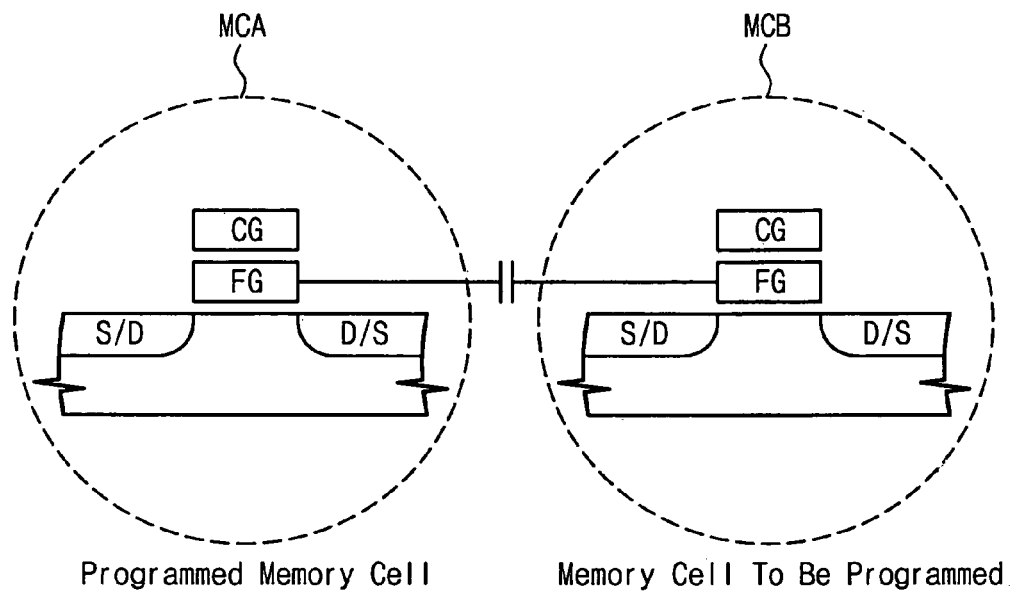
FIG. 2 illustrates an electric field coupling/F-poly coupling generated between memory cells.

The present invention will now be described more fully hereinafter with reference to the accompanying drawings in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 4:
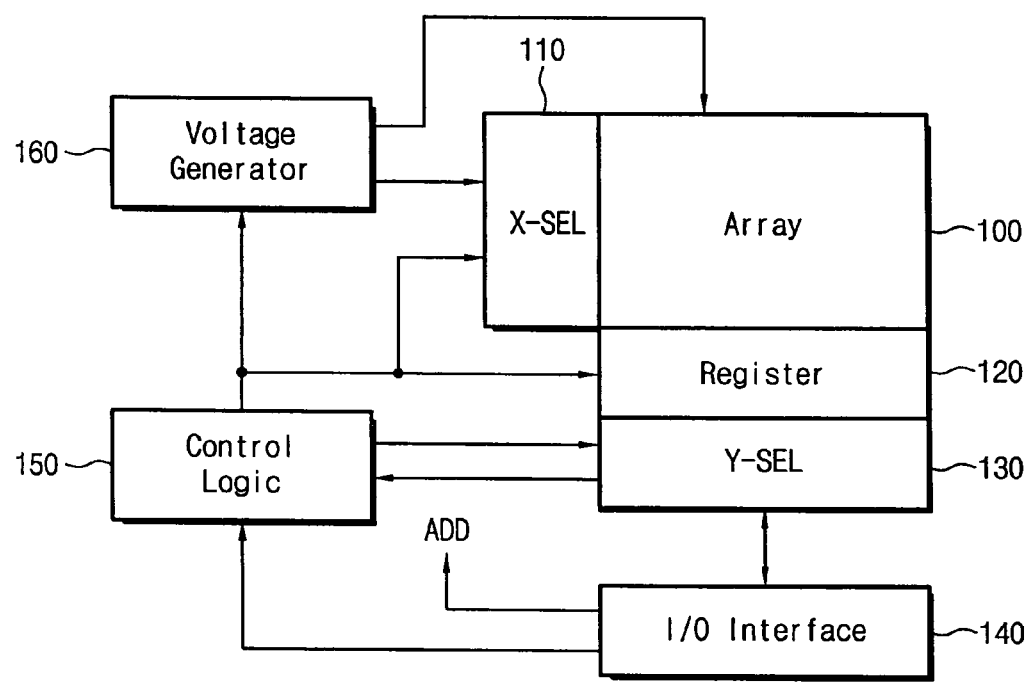
FIG. 4 is a block diagram of a flash memory device adapted for use with an embodiment of the invention.

FIG. 4 is a block diagram of a flash memory device adapted for use with an embodiment of the invention. The flash memory device comprises a memory cell array 100 adapted to store data information. The memory cell array 100 includes a plurality of memory blocks each having a memory cell configuration illustrated in FIG. 5.

Figure 5:
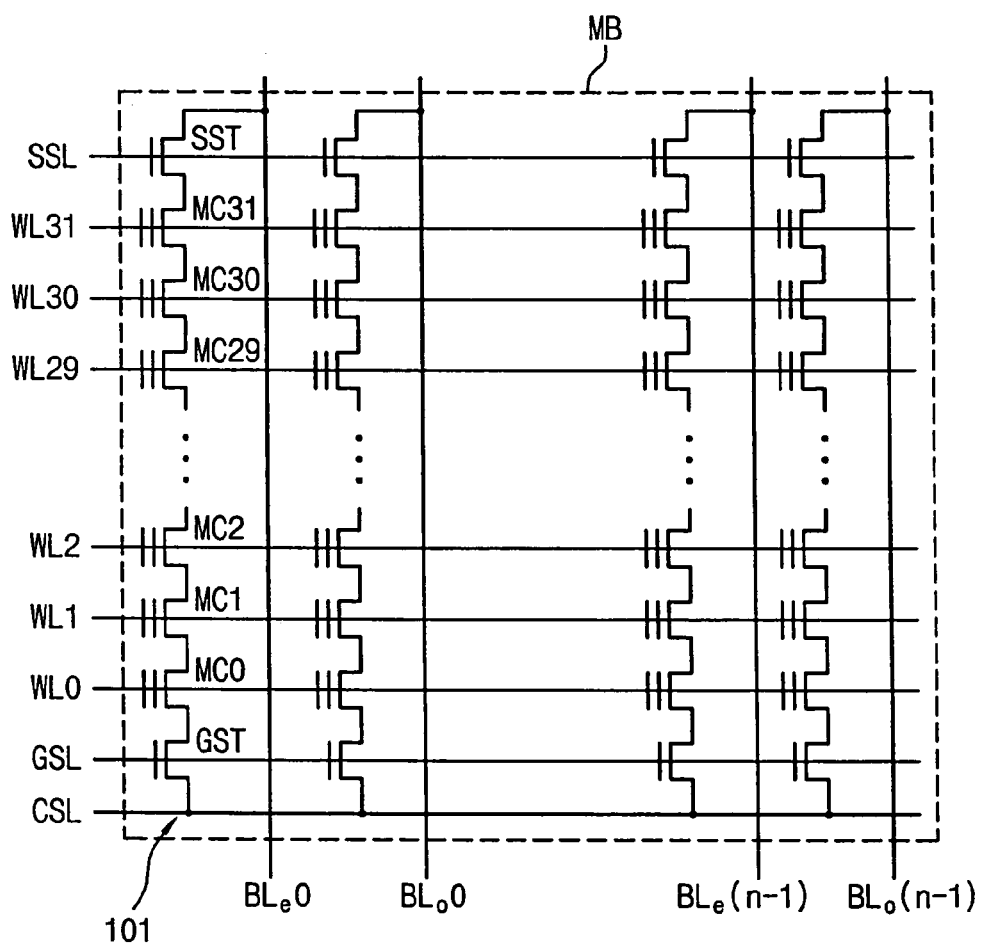
FIG. 5 is a circuit diagram of a memory cell array illustrated in FIG. 4.

FIG. 5 is a circuit diagram of the memory cell array illustrated in FIG. 4 comprising a memory block MB that includes a plurality of strings 101 each having a string select transistor SST, a ground select transistor GST, and memory cells MC31-MC0. The string selection transistor SST is controlled by a string select line SSL and has a drain connected to a corresponding bitline. The memory cells MC31-MC0 are serially coupled between a source of the string select transistor SST and a drain of the ground select transistor GST and controlled by corresponding wordlines WL31-WL0, respectively. A plurality of bitline pairs (BLe0, BLo0)-(BLe(n-1), BLo(n-1)) are arranged to cross the wordlines WL31-WL0. During read/program operations, one bitline of each bitline pair is selected by a page buffer block 120, which means that one wordline includes two pages. Hereinafter, bitlines denoted as "e" will be referred to as "even-number bitlines" and bitlines denoted as "o" will be referred to as "odd-number bitlines". On the other hand, it will be understood by those skilled in the art that one wordline may include one page.

Returning to FIG. 4, row selector circuit (X-SEL) 100 is controlled by control logic 150. The row selector circuit 100 selects one of the memory blocks in response to an address (ADD) provided through an input/output (i/O) interface 140 which controls rows (including wordlines and select lines) of the selected memory block. A register block 120 is controlled by control logic 150 and functions as a sense amplifier or a write driver according to an operation mode. Although not illustrated in this figure, register block 120 may be comprised of page buffers. Each of the page buffers is electrically connected to one bitline or one of a pair of bitlines and reads data from a memory cell or stores data in the memory cell through a bitline.

A column selector circuit (Y-SEL) 130 is controlled by control logic 150 and outputs data stored in register block 120 to I/O interface 140 or the control logic 150 in response to the address ADD provided through I/O interface 140. For example, in a normal read operation, the column selector circuit 130 outputs data stored in register block 120 to I/O interface 140. In a verify normal read operation, the column selector circuit 130 outputs data stored in the register block 120 to control logic 150 and control logic 150 judges whether the data provided from column selector circuit 130 is pass data. During a data loading period of a programming operation, column selector circuit 130 outputs program data transferred through I/O interface 140 to the register block 120. The control logic 150 is configured to control general operations of a flash memory device. A voltage generator 160 is controlled by control logic 150 and configured to generate voltages (e.g., a wordline voltage, a bulk voltage, a read voltage, a pass voltage, etc.) required for program/erase/read operations.

As described below, a flash memory device according to an aspect of the present invention adopts a novel programming technology for sufficiently securing a read margin between states even if memory cells are subjected to an electric field coupling/F-poly coupling and HTS. In accordance with the programming of the present invention, 2-bit data is stored in respective memory cells of a selected page so that memory cells are programmed using target threshold voltages of respective desired states. This is hereinafter referred to as a "primary program operation". After the primary program operation is completed, read operations are executed to detect memory cells arranged within a predetermined threshold voltage region among the memory cells of the respective states. The detected memory cells are programmed to have a higher threshold voltage than target threshold voltages of the respective states. This is hereinafter referred to as a "secondary program operation".

The primary program operation for storing 2-bit data varies with the configuration of register block 120. For example, after loading both LSB and MSB data bits on register block 120, the primary program operation may be executed. Alternatively, programming MSB data bit (hereinafter referred to as "MSB program operation") may be followed by programming LSB data bit (hereinafter referred to as "LSB program operation"). The latter program method, as an exemplary program method, will now be described in brief with reference to FIG. 6A and FIG. 6B.

Figure 6A:
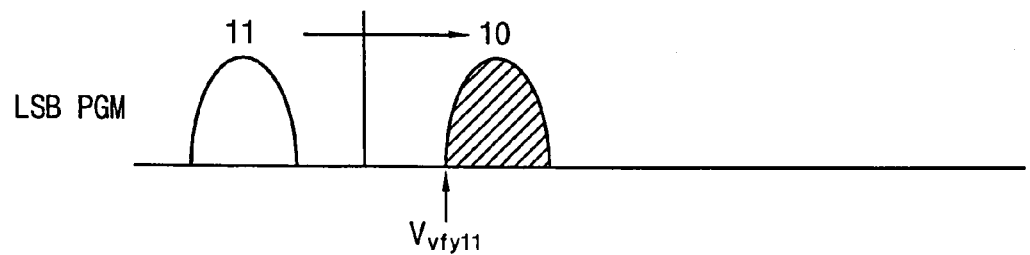
FIG. 6A and FIG. 6B illustrate a multi-bit programming operation according to an embodiment of the invention.
Figure 6B:
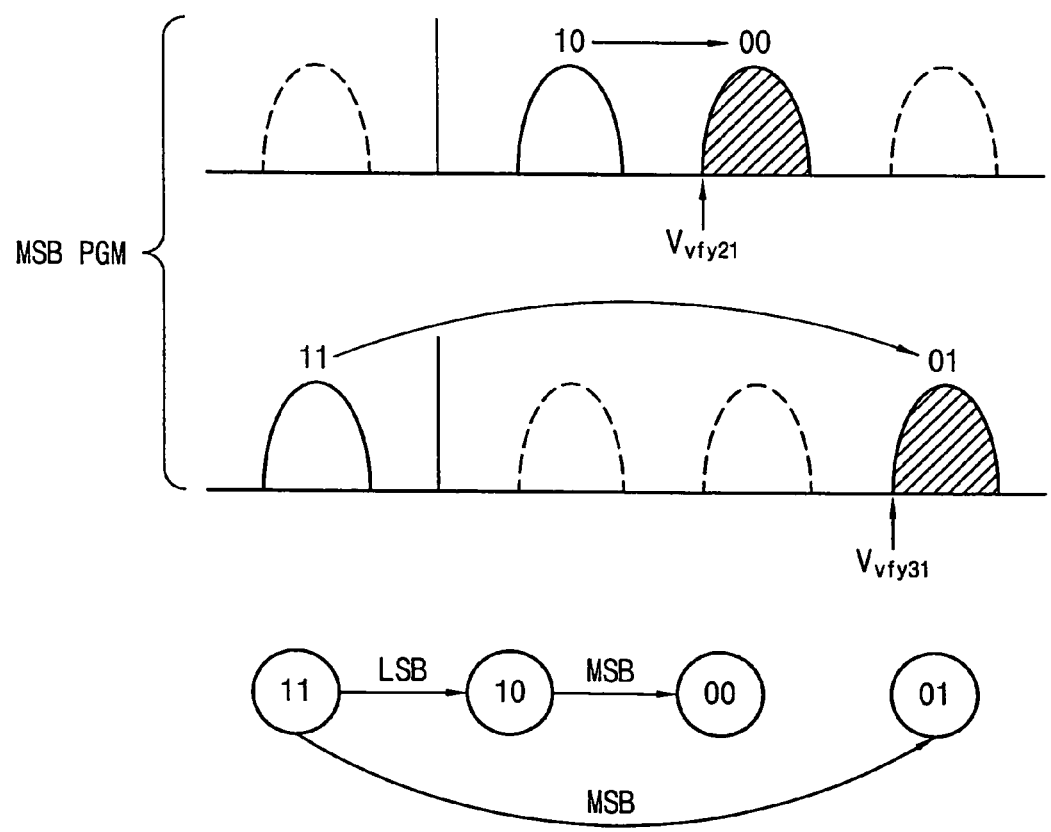

One memory cell is programmed to have one of "11", "10", "00", and "01" states. For the convenience of description, it is assumed that the "11", "10", "00", and "01" states correspond to ST0, ST1, ST2, and ST3, respectively. A memory cell having the "11" state is an erased memory cell and a threshold voltage of a memory cell having the "10" state is higher than that of the memory cell having the "11" state. A threshold voltage of a memory cell having the "00" state is higher than that of a memory cell having the "10" state. Further, a threshold voltage of a memory cell having the "01" state is higher than that of a memory cell having the "00" state. If an LSB program operation is executed under the foregoing condition, a memory cell has an erased state or a "10" state, as illustrated in FIG. 6A. If an MSB program operation is executed following the LSB program operation, a memory cell having the "11" state has an erased state or a "01" state while a memory cell having the "10" state has a "10" or "00" state, as illustrated in FIG. 6B.

In the present invention, two program operations are executed when any wordline is selected. More specifically, a program operation for memory cells connected to the selected wordline and even-number bitlines BLe0-BLe(n−1) is followed by a program operation for memory cells connected to the selected wordline and odd-number bitlines BLo0-BLo(n−1). For the convenience of description, a program operation according to the invention will be described according to the above order. However, it will be understood by those skilled in the art that a program operation for memory cells connected to the selected wordline and odd-number bitlines BLo0-BLo(n−1) may be followed by a program operation for memory cells connected to the selected wordline and even-number bitlines BLe0-BLe(n−1).

Figure 7:
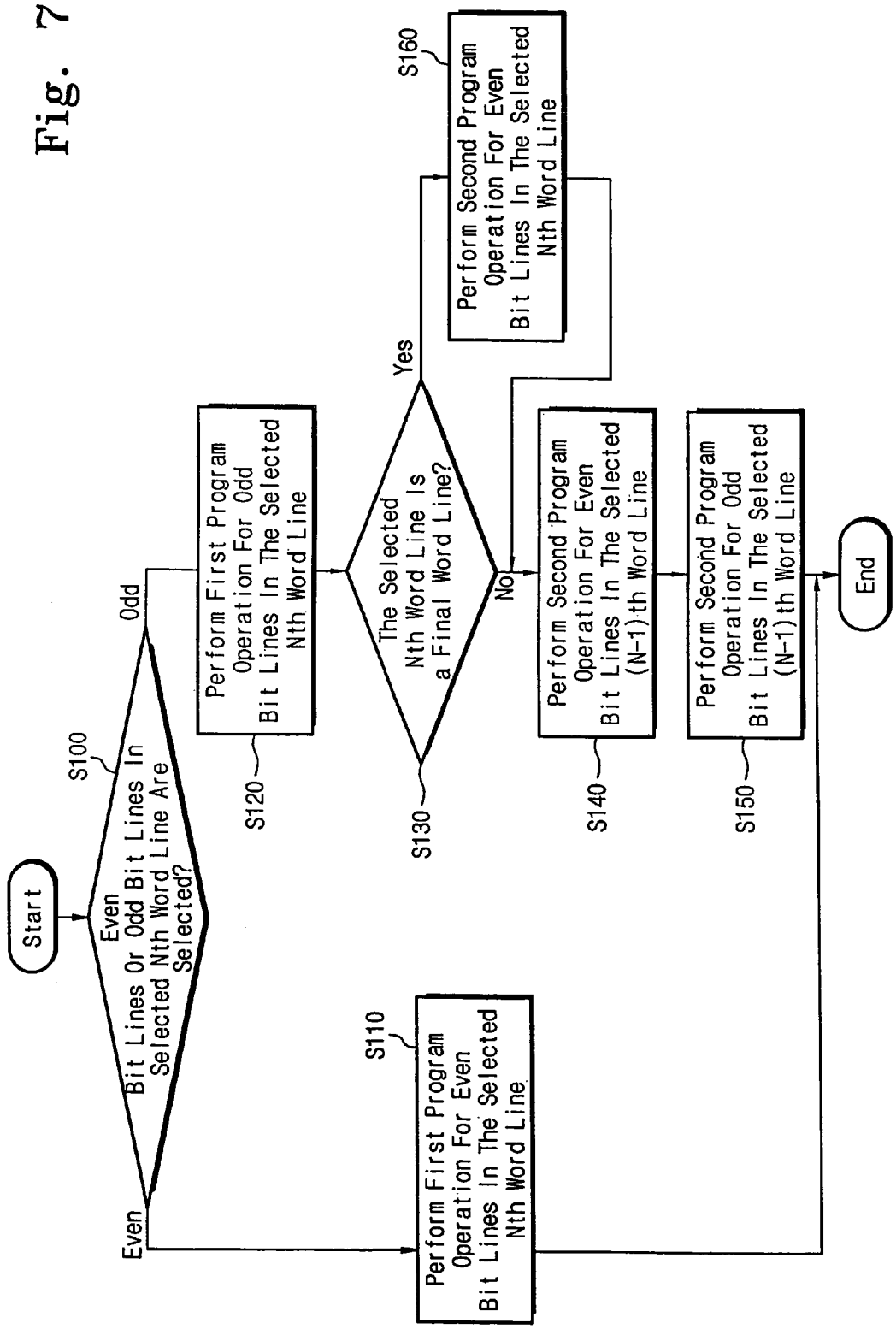
FIG. 7 is a flowchart illustrating a programming method for a flash memory device according to an embodiment of the invention.

FIG. 7 is a flowchart illustrating a programming method of a flash memory device in accordance with an embodiment of the present invention. When a program operation starts, control logic 150 determines, in step S100, whether even-number bitlines BLe0-BLe(n−1) on a selected wordline (e.g., $N^{th}$ wordline) are selected. This determination is done based on address information provided through input/output interface (I/O interface) 140. When the even-number bitlines BLe0-BLe(n−1) are selected, the primary program operation for memory cells connected with the selected wordline WLn and the even-number bitlines BLe0-BLe(n−1) is executed by control logic 150 in step S110. While the primary program operation is executed, the selected memory cells are programmed to one of states ST1, ST2, and ST3 shown in FIG. 9, respectively. Based on verify voltages Vvfy11, Vvfy12, and Vvfy13 corresponding to the states ST1, ST2, and ST3, it is determined whether the memory cells are programmed to the respective states. For example, the verify voltage Vvfy11 is used to determine whether a memory cell is programmed to the state ST1; the verify voltage Vvfy12 is used to determine whether a memory cell is programmed to the state ST2; and the verify voltage Vvfy13 is used to determine whether a memory cell is programmed to the state ST3. Once these states are verified the primary program procedure ends.

When the odd-number bitlines BLo0-BLo(n−1) are selected as determined at step S100, the primary program operation for memory cells connected with the selected wordline WLn and the odd-number bitlines BLo0-BLo(n−1) is executed by control logic 150 at step S120. The primary program operation is executed as described above. Once the program operation for memory cells connected with the selected wordline WLn and the odd-number bitlines BLo0-BLo(n−1) is ended, control logic 150 determines whether the currently selected wordline is the last wordline in the selected memory block at step S130. A program order of the wordlines is ascending order. When the currently selected wordline is not the last wordline in the selected memory block, the secondary program operation is executed for a wordline WL(n−1) disposed directly below a selected wordline WLn. First, a secondary program operation is executed for memory cells connected with the wordline WL(n−1) and even-number bitlines BLe0-BLe(n−1) at step S140. The secondary program operation is also executed for memory cells connected with the wordline WL(n−1) and the odd-number bitlines BLo0-BLo(n−1) at step S150. As will be described later, memory cells arranged within a predetermined region among threshold voltage regions of the respective states are reprogrammed by the secondary program operation to have a higher threshold voltage. Unlike the description with reference to FIG. 7, the secondary program operation for memory cells connected with the wordline WL(n−1) and the odd-number bitlines BLo0-BLo(n−1) may be followed by a secondary program operation for memory cells connected with the wordline WL(n−1) and the even-number bitlines BLe0-BLe(n−1).

If the determination, at step S130, that the currently selected wordline WLn is the last wordline in a selected memory block, the secondary program operation for memory cells in the last wordline ($N^{th}$ Word Line) and even-number bitlines BLe0-BLe(n−1) is executed at step S160 before executing step S140. This routine proceeds to step S140, as described above, in which a program operation (i.e., secondary program operation) is executed for the wordline WL(n−1) disposed directly below the selected wordline WLn. Alternatively, when the currently selected wordline WLn is the last wordline in the selected memory block, a secondary program operation may be executed for all memory cells connected with the last wordline (i.e., wordlines connected with even-number bitlines and odd-number bitlines) before executing the secondary program operation for the wordline WL(n−1) disposed directly below the selected wordline WLn.

Figure 8A:
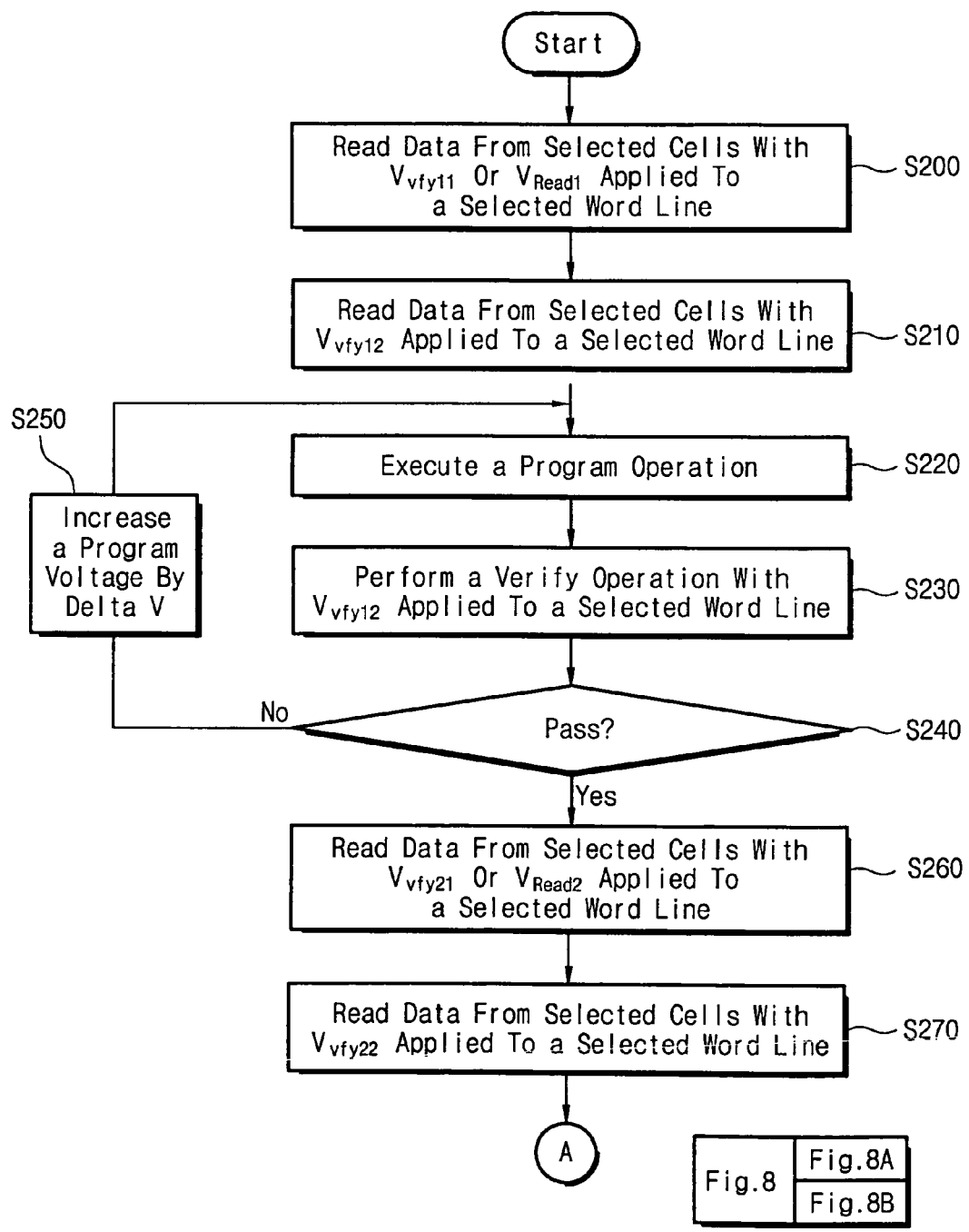
FIG. 8 is a flowchart illustrating a secondary programming method illustrated in FIG. 7.
Figure 8B:
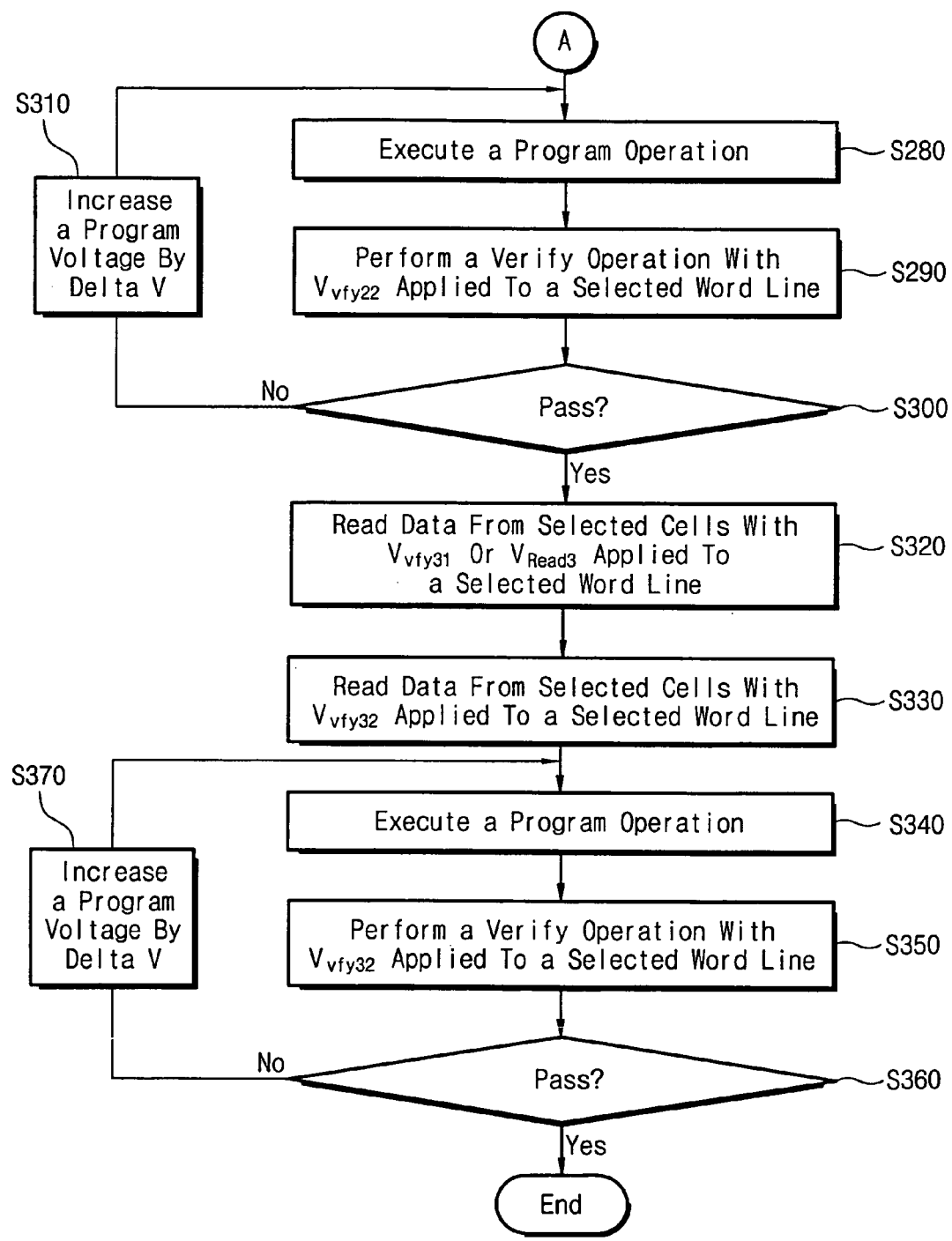
Figure 9:
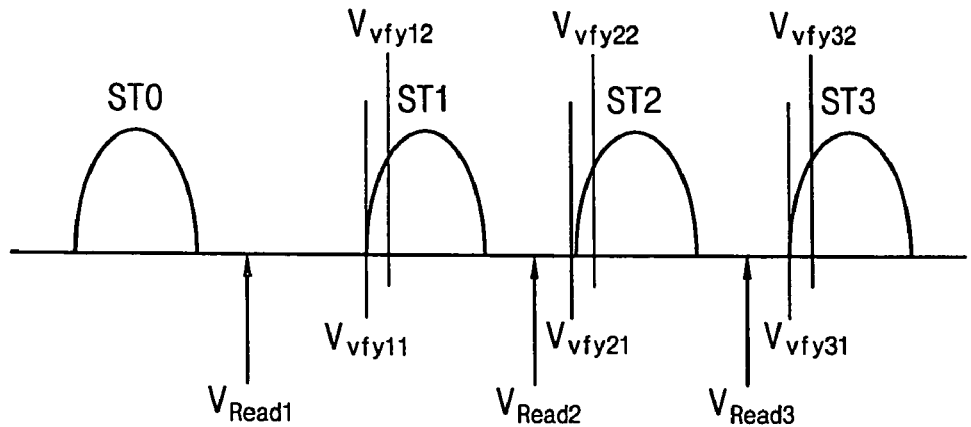
FIG. 9 illustrates verify voltages when executing a programming operation for a flash memory device according to an embodiment of the invention.

FIG. 8 is a flowchart illustrating the secondary program operation of a flash memory device in accordance with the present invention. FIG. 9 illustrates the verify voltages when executing the program operation of a flash memory device according to the present invention.

As described with reference to FIG. 7, after a first program operation for 2-bit data is ended and a currently selected wordline WLn is not the last wordline, a secondary program operation is executed at step S140 for memory cells connected with a wordline WL(n−1) disposed directly below the selected wordline WLn. The secondary program operation for programmed memory cells connected with a wordline WL(n−1) and even-number bitlines BLo0-BLo(n−1) will be described below. While a verify voltage Vvfy11 (or read voltage Vread1) is applied to a selected wordline WL(n−1), a read operation is executed through register block 120 at step S200 shown in FIG. 8A. Thereafter, while a verify voltage Vvfy12 higher than the verify voltage Vvfy11 is applied to the selected wordline WL(n−1), a read operation is executed through register block 120 at step S210. By executing the read operation twice in steps S200 and S210, memory cells having threshold voltages between verify voltages Vvfy11 and Vvfy12 (or a read voltage Vread1 and the verify voltage Vvfy12) (see FIG. 9) are detected. It will be understood by those skilled in the art that the method of detecting memory cells having threshold voltages between verify voltages Vvfy11 and Vvfy12 (or a read voltage Vread1 and the verify voltage Vvfy12) may vary with the configuration of register block 120.

If the memory cells having the threshold voltages between the verify voltages Vvfy11 and Vvfy12 (or the read voltage Vread1 and the verify voltage Vvfy12) are detected, a program operation (i.e., secondary program operation) is executed to the detected memory cells at step S220. After the program operation is executed, a verify read operation is executed while the verify voltage Vvfy12 acting as a read voltage is applied to the selected wordline WL(n−1) at step S230. A determination is made at step S240 whether the detected memory cells are programmed to have a threshold voltage corresponding to the verify voltage Vvfy12. When the determination result is that all the detected memory cells are not programmed with a required threshold voltage, a program voltage to be applied to the selected wordline WL(n−1) increases by a predetermined increment at step S250 and the routine returns to step S220. The program loop from step 220 to step S250 repeats either a predetermined number of times or until all detected memory cells are programmed.

When the determination result is that all the detected memory cells are programmed with a required threshold voltage, the answer to step S240 is yes and the program proceeds to step S260 where a read operation is executed through register block 120 while a verify voltage Vvfy21 (or a read voltage Vread2) is applied to the selected wordline WN(n−1). Thereafter, a read operation is executed through the register block 120 while a verify voltage vfy22, higher than the verify voltage Vvfy21, is applied to the selected wordline WL(n−1) at step S270. By executing the read operation twice at steps S260 and S270, memory cells having threshold voltages between the verify voltages Vvfy21 and Vvfy22 (or the read voltage Vread2 and the verify voltage Vvfy22) (see FIG. 9) are detected. If the memory cells having threshold voltages between the verify voltages Vvfy21 and Vvfy22 (or the read voltage Vread2 and the verify voltage Vvfy22) are detected, a program operation (i.e., secondary program operation) is executed for the detected memory cells at step S280. After the program operation is executed, step S290 executes a verify read operation while the verify voltage Vvfy22, acting as a read voltage, is applied to the selected wordline WL(n−1). A determination is made at step S300 whether the detected memory cells are programmed to have a threshold voltage corresponding to verify voltage Vvfy22. When the determination result is that all the detected memory cells are not programmed with a required threshold voltage, a program voltage to be applied to a selected wordline increases by a predetermined increment at step S310. This routine returns to step S280, which is repeated until the program loop comprising the S280-S310 runs a predetermined number of times or the memory cells are all programmed with the required threshold voltage.

When the determination result is that all the detected memory cells are programmed with a required threshold voltage, a read operation is executed at step S320 through register block 120 while a verify voltage Vvfy31 (or a read voltage Vread3) is applied to the selected wordline WL(n−1). Thereafter, a read operation is executed through the register block 120 while a verify voltage Vvfy32 higher than the verify voltage Vvfy31 is applied to the selected wordline WL(n−1) (S330). By executing the read operation twice at steps S320 and S330, memory cells having threshold voltages between the verify voltages Vvfy31 and Vvfy32 (or the read voltage Vread3 and the verify voltage Vvfy32) (see FIG. 9) are detected. If the memory cells having threshold voltages between the verify voltages Vvfy31 and Vvfy32 (or the read voltage Vread3 and the verify voltage Vvfy32) (see FIG. 9) are detected, step S340 executes a program operation (i.e., secondary program operation) for the detected memory cells. After the program operation is executed, a verify read operation is executed while the verify voltage Vvfy32 acting as a read voltage is applied to the selected wordline WL(n−1) (S350). A determination is made at step S360 whether the detected memory cells are programmed to have a threshold voltage corresponding to the verify voltage Vvfy32. When the determination result is that all the detected memory cells are not programmed with a required threshold voltage, step S370 increases a program voltage to a selected wordline by a predetermined increment. This routine proceeds to step S340, which is repeated until the program loop defined by steps S340-S370 is repeated a predetermined number of times or the memory cells are all programmed.

When the determination result is that all the detected memory cells are programmed with the required threshold voltage, a secondary program operation is executed for programmed memory cells connected with the wordline WL(n−1) and odd-number bitlines BLo0-BLo(n−1), as illustrated in FIG. 7. This secondary program operation is identical to that described above and will not be described in further detail. After a primary program operation for 2-bit data is ended and the currently selected wordline is the last wordline, a secondary program operation is executed for programmed memory cells connected with a selected wordline, i.e., the last wordline and even-number bitlines BLe0-BLe(n−1). This secondary program operation is identical to that described above and will not be described in further detail.

Figure 3:
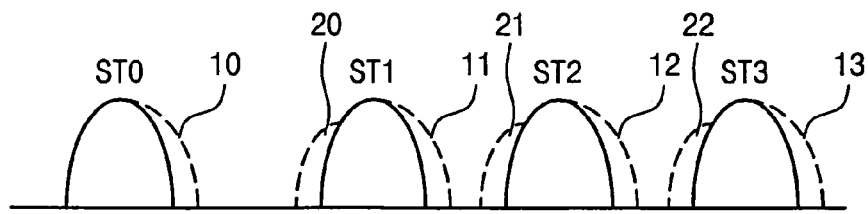
FIG. 3 illustrates widened threshold voltage distributions due to high temperature stress (HTS).
Figure 10:
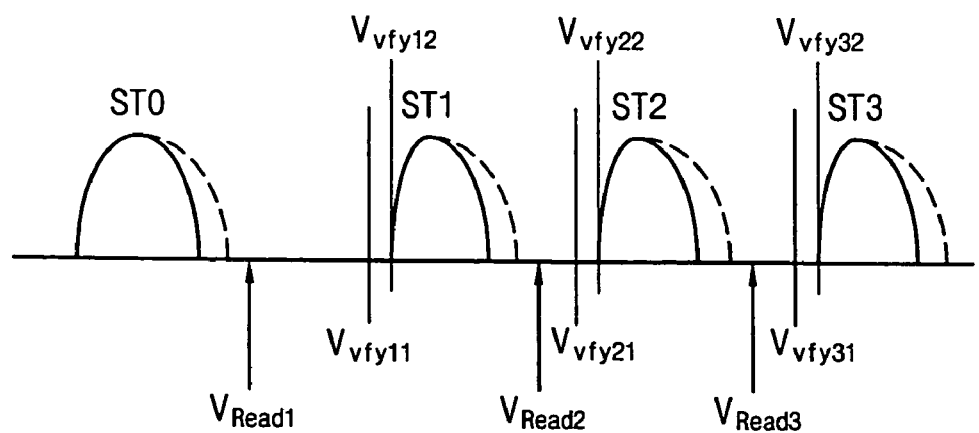
FIG. 10 illustrates threshold voltage distributions after executing a programming operation for a flash memory device according to an embodiment of the invention.

FIG. 10 illustrates threshold voltage distributions after executing a program operation of a flash memory device according to the present invention. In a threshold voltage distribution corresponding to a state ST1, memory cells between verify voltages Vvfy11 and Vvfy12 (or a read voltage Vread1 and the verify voltage Vvfy12) are programmed to have the verify voltage Vvfy12 or a voltage higher than the verify voltage Vvfy12. As can be seen in FIG. 10 and FIG. 3, a margin between states ST0 and ST1 increases. In a threshold voltage corresponding to a state ST2, verify voltages Vvfy21 and Vvfy22 (or a read voltage Vread2 and the verify voltage Vvfy22) are programmed to have the verify voltage Vvfy22 or a voltage higher than the verify voltage Vvfy22. As can be seen in FIG. 10 and FIG. 3, a margin between states ST1 and ST2 increases. Similarly, in a threshold voltage distribution corresponding to a state ST3, memory cells between verify voltages Vvyf31 and Vvfy32 (or read and verify voltages Vread3 and Vvfy32) are programmed to have the verify voltage Vvfy32 or a voltage higher than the verify voltage Vvfy32. As can be seen in FIG. 9 and FIG. 3, a margin between states ST2 and ST3 increases. Namely, a read margin between adjacent states increases more than a read margin illustrated in FIG. 3. Thus, although a threshold voltage distribution is widened due to an electric field coupling/F-poly coupling and HTS, a read margin between adjacent states may be sufficiently secured using the program method according to the present invention.

The secondary program operation is not limited to the embodiment of the invention and many modifications and changes thereof may be made. For example, states ST1, ST3, and ST3 may be programmed during a secondary program operation. Read voltages required for reading data of programmed memory cells according to the invention may be set to the same value as read voltages used to execute only a primary program operation.

After being subjected to a primary program operation, memory cells arranged within a specific region of respective states are subjected to a secondary program operation to have a threshold voltage equivalent to or higher than a verify voltage of the primary program operation. Thus, although a threshold voltage distribution is widened due to an electric field coupling/F-poly coupling and HTS, a read margin between adjacent states may be sufficiently secured using the program method according to the present invention.

Although the present invention has been described in connection with selected embodiments, as illustrated in the accompanying drawings, it is, however, not limited thereto. It will be apparent to those skilled in the art that various substitution, modifications and changes may be thereto without departing from the scope of the invention as defined by the following claims.

What is claimed is:

1. A programming method for a flash memory device comprising first and second bitlines connected to a plurality of memory cells adapted to store multi-bit data indicating one of a plurality of states, the programming method comprising:

(a) programming memory cells, connected with a selected row and the second bitlines, with multi-bit data;

(b) determining whether the selected row is the last row; and (c) when the selected row is the last row, reprogramming programmed memory cells connected with the last row and the first bitlines wherein said reprogramming increases a read margin between adjacent states of said plurality of states where a threshold voltage associated with said memory cells was decreased due to high temperature stress (HTS).

2. The programming method of claim 1, wherein the step of reprogramming further comprises:

detecting the programmed memory cells within a predetermined threshold voltage region among the memory cells of the respective states, said predetermined region of the respective states selected from one of a first verify voltage, a read voltage and a second verify voltage, the first verify voltage being lower than the second verify voltage and higher than the read voltage; and programming the detected memory cells to have a second verify voltage corresponding to the respective states and a threshold voltage higher than the second verify voltage.

3. The programming method of claim 2, wherein the first verify voltage corresponding to the respective states is used to determine whether the selected memory cells are programmed with multi-bit data.

4. The programming method of claim 2, wherein if the detected memory cells are programmed to have a threshold voltage equivalent to or higher than the second verify voltage corresponding to the respective states, a program voltage is applied to a selected wordline by a predetermined increment according to the respective states.

5. The programming method of claim 4, wherein the program voltage is repeatedly applied to a selected wordline until the threshold voltage is equivalent to or higher than the second verify voltage.

6. The programming method of claim 1, further comprising:

(d) when the selected row is not the last row, reprogramming programmed memory cells connected with a row disposed directly below the selected row and the first bitlines wherein said reprogramming increases a read margin between adjacent states of said plurality of states where a threshold voltage associated with said memory cells was decreased due to high temperature stress (HTS).

7. The programming method of claim 6, wherein the step (d) further comprises:

detecting the programmed memory cells within a predetermined threshold voltage region among the memory cells of the respective states, said predetermined region of the respective states is selected from one of a first verify voltage, a read voltage and a second verify voltage, said first verify voltage being lower than the second verify voltage and higher than the read voltage; and programming the detected memory cells to have a threshold voltage equivalent to or higher than the second verify voltage corresponding to the respective states.

8. The programming method of claim 7, wherein the first verify voltage is used to determine whether the selected memory cells are programmed with multi-bit data.

9. The programming method of claim 7, wherein if the detected memory cells are programmed to have a threshold voltage equivalent to or higher than the second verify voltage corresponding to the respective states, a program voltage is applied to a selected wordline by a predetermined increment according to the respective states.

10. The programming method of claim 7, wherein when the detected memory cells are programmed to have a threshold voltage equivalent to or higher than the second verify voltage corresponding to the respective states, a program voltage is applied to a selected wordline by a constant amount regardless of the respective state.

11. The programming method of claim 9, wherein the program voltage is repeatedly applied to a selected wordline until the threshold voltage is equivalent to or higher than the second verify voltage.

12. The programming method of claim 7, further comprising:

(e) reprogramming memory cells connected with a row disposed directly below the selected row and the second bitlines such that said reprogramming increases a read margin between adjacent states of said plurality of states where a threshold voltage associated with said memory cells was decreased due to high temperature stress (HTS).

13. The programming method of claim 12, wherein the step (e) further comprises:

detecting the programmed memory cells within a predetermined threshold voltage region among the memory cells of the respective states, said predetermined region of the respective states is selected from one of a first verify voltage, a read voltage and a second verify voltage, said first verify voltage being lower than the second verify voltage and higher than the read voltage; and programming the detected memory cells to have a threshold voltage equivalent to or higher than the second verify voltage corresponding to the respective states.

14. The programming method of claim 13, wherein the first verify voltage corresponding to the respective state is used to determine whether the selected memory cells are programmed with multi-bit data.

15. The programming method of claim 13, wherein if the detected memory cells are programmed to have a threshold voltage equivalent to or higher than the second verify voltage corresponding to the respective states, a program voltage is applied to a selected wordline by a predetermined increment according to the respective states.

16. The programming method of claim 13, wherein when the detected memory cells are programmed to have a threshold voltage equivalent to or higher than the second verify voltage corresponding to the respective states, a program voltage is applied to a selected wordline by a constant amount regardless of the respective state.

17. The programming method of claim 15, wherein the program voltage is repeatedly applied to a selected wordline until the threshold voltage is equivalent to or higher than the second verify voltage.

18. The programming method of claim 1, further comprising:

programming memory cells, connected with the selected row and the first bitlines, with multi-bit data corresponding to a memory state when the memory cells are selected.

* * * * *